(12) United States Patent
Kume et al.

(10) Patent No.: US 9,373,679 B2
(45) Date of Patent: Jun. 21, 2016

(54) SEMICONDUCTOR DEVICE COMPRISING CAPACITIVE ELEMENT

(71) Applicant: Renesas Electronics Corporation, Kawasaki-shi (JP)

(72) Inventors: Ippei Kume, Tokyo (JP); Naoya Inoue, Tokyo (JP); Yoshihiro Hayashi, Tokyo (JP)

(73) Assignee: RENESAS ELECTRONICS CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/449,872

(22) Filed: Aug. 1, 2014

(65) Prior Publication Data

US 2015/0024593 A1    Jan. 22, 2015

Related U.S. Application Data

(62) Division of application No. 12/864,091, filed as application No. PCT/JP2009/050937 on Jan. 22, 2009, now Pat. No. 8,810,000.

(30) Foreign Application Priority Data

Jan. 22, 2008    (JP) ................................. 2008-011210

(51) Int. Cl.
*H01L 21/31*    (2006.01)
*H01L 49/02*    (2006.01)
*H01L 21/316*    (2006.01)
(Continued)

(52) U.S. Cl.
CPC .......... *H01L 28/60* (2013.01); *H01L 21/28506* (2013.01); *H01L 21/31637* (2013.01); *H01L 21/32053* (2013.01); *H01L 21/32105* (2013.01); *H01L 23/5223* (2013.01); *H01L 23/5283* (2013.01); *H01L 23/5286* (2013.01); *H01L 27/0688* (2013.01); *H01L 28/75* (2013.01); *H01L 2924/0002* (2013.01)

(58) Field of Classification Search
CPC ..................... H01L 21/31637; H01L 23/5223; H01L 23/5283; H01L 23/5286
See application file for complete search history.

(56) References Cited

U.S. PATENT DOCUMENTS 4,822,642 A * 4/1989 Cabrera et al. ........... 427/255.26
6,150,706 A   11/2000 Thakur et al.
(Continued)

FOREIGN PATENT DOCUMENTS

JP    58-220457 A    12/1983
JP    11-135774 A    5/1999
(Continued)

OTHER PUBLICATIONS

International Search Report for PCT/JP2009/050937 dated Apr. 14, 2009.

(Continued)

*Primary Examiner* — Matthew Reames
(74) *Attorney, Agent, or Firm* — McGinn IP Law Group PLLC

(57) ABSTRACT

A semiconductor device production method includes forming a transition metal film, irradiating a surface of the transition metal film with a mono-silane gas to form a silicon-containing transition metal film, and oxidizing the silicon-containing transition metal film by an oxygen plasma treatment, thereby forming a transition metal silicate film.

20 Claims, 17 Drawing Sheets

(51) Int. Cl.
  *H01L 23/522*    (2006.01)
  *H01L 23/528*    (2006.01)
  *H01L 27/06*     (2006.01)
  *H01L 21/285*    (2006.01)
  *H01L 21/3205*   (2006.01)
  *H01L 21/321*    (2006.01)

(56) References Cited

U.S. PATENT DOCUMENTS

| | | | |
|---|---|---|---|
| 6,461,914 | B1 | 10/2002 | Roberts et al. |
| 2006/0014386 | A1 | 1/2006 | Lai et al. |
| 2006/0124983 | A1 | 6/2006 | Kutsunai et al. |
| 2007/0262417 | A1 | 11/2007 | Ohtake et al. |

FOREIGN PATENT DOCUMENTS

| | | | |
|---|---|---|---|
| JP | 2001-053254 A | 2/2001 |
| JP | 2004-079687 A | 3/2004 |
| JP | 2004-356528 A | 12/2004 |
| JP | 2006-054382 A | 2/2006 |
| JP | 2007-129190 A | 5/2007 |
| JP | 2007-184324 A | 7/2007 |
| JP | 2007-305654 A | 11/2007 |

OTHER PUBLICATIONS

Notice of Allowance dated Apr. 14, 2014 in co-pending U.S. Appl. No. 12/864,091.
Office Action dated Feb. 6, 2013 in co-pending U.S. Appl. No. 12/864,091.
Office Action dated Sep. 6, 2012 in co-pending U.S. Appl. No. 12/864,091.
Requirement for Restriction/Election dated Jun. 29, 2012 in co-pending U.S. Appl. No. 12/864,091.

* cited by examiner

FIG.6
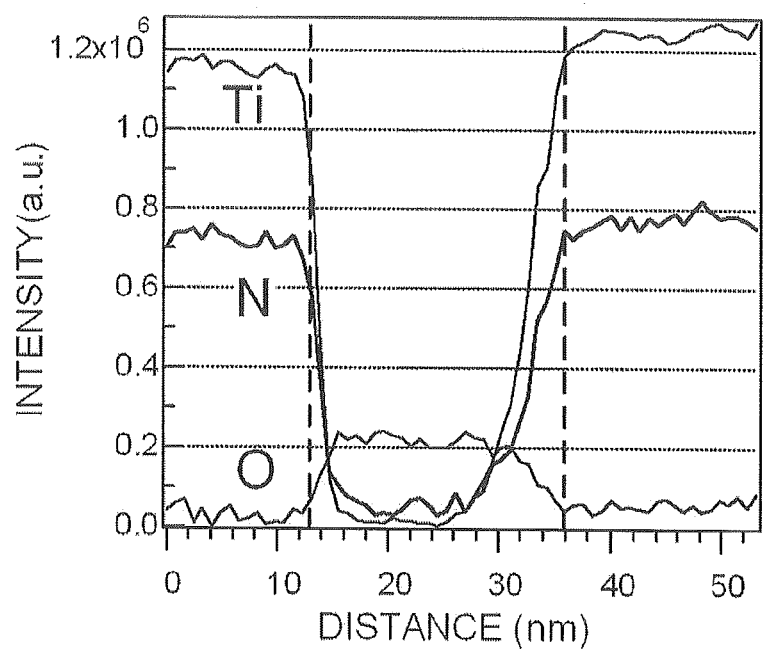
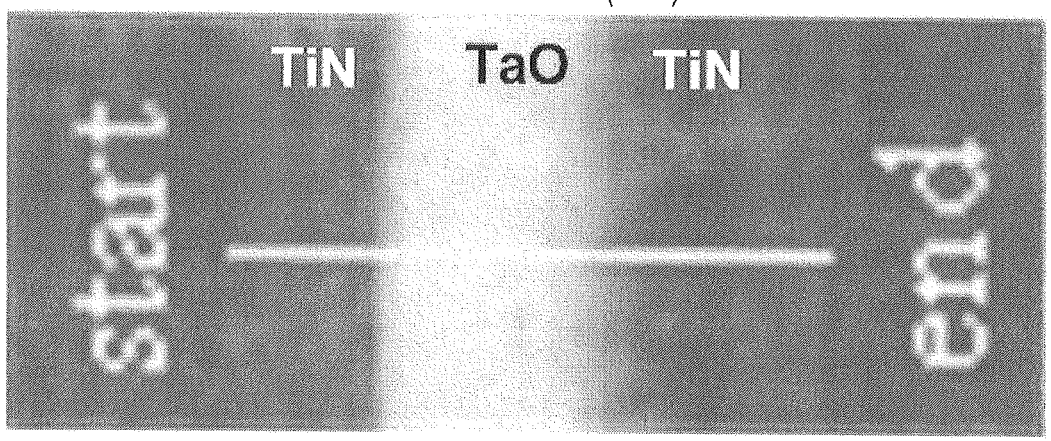

FIG.14
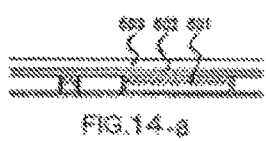
FIG.14-a
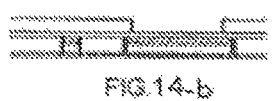
FIG.14-b
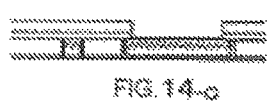
FIG.14-c
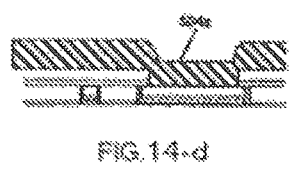
FIG.14-d
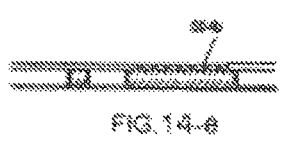
FIG.14-e
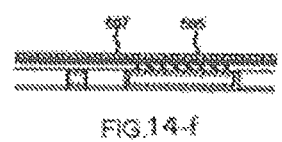
FIG.14-f
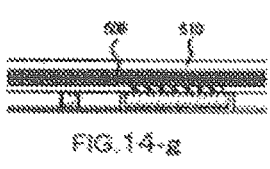
FIG.14-g
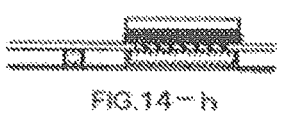
FIG.14-h
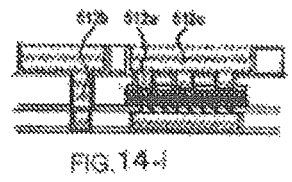
FIG.14-i

SEMICONDUCTOR DEVICE COMPRISING CAPACITIVE ELEMENT The present application is a Divisional application of U.S. patent application Ser. No. 12/864,091, filed on Aug. 9, 2010, which is based on International Application No. PCT/JP2009/050937, filed on Jan. 22, 2009, which is based on Japanese patent application No. JP 2008-011210, filed on Jan. 22, 2008, the entire contents of which are incorporated herein by reference.

TECHNICAL FIELD

The present invention relates to a semiconductor device comprising a capacitive element on a multilayer wiring structure or in a multilayer wiring and a production method thereof.

BACKGROUND ART

Conventional capacitive elements for high frequency devices or for decoupling are capacitive elements having a PIP (polysilicon/insulating film/polysilicon) structure in which polysilicon is used for both, upper and lower, electrodes or a MOS (polysilicon electrode/gate silicon oxide film/silicon substrate) structure. However, polysilicon electrodes have problems such as large resistance and depletion. MIM (metal/capacitive insulating film/metal) structures are employed in which a metal or metal oxide film, such as titanium nitride and ruthenium oxide, is used for the electrodes. To date, titanium oxide films are extensively studied for the electrodes in MIM structures. This is because the electrodes in an MIM structure have low electric resistance and easy to form by etching.

Recently, as LSIs become smaller and highly integrated, MIM capacitors have a reduced occupying area. Then, there is an increasing demand for a capacitor having a large capacitance and a small area. For this reason, in place of conventional capacitive insulating film structures using silicon oxide films or gate oxide films, usage of high dielectric constant (High-k) materials such as high relative dielectric constant metal oxide films (for example, TaO, HfD, and ZrO) and metal silicate films (for example, HfSiO) as capacitive insulating films has been discussed. However, even if a High-k material is used, the insulating film has to have a thickness reduced to 20 nm or smaller in order to realize a capacitive density of 10 fF/$\mu$m$^2$ or higher, which is required in LSIs having a line width or 65 nm or smaller.

Metal oxide films generally have a high relative dielectric constant but a problem is that they are accompanied by high current leakage. Heat treatment following formation of a metal oxide film causes crystallization, which may increase current leakage running through the crystal grain boundary. Conversely, if no heat treatment is performed, insufficient oxidization causes oxygen defects, which provide leakage paths and, again, may increase current leakage. When the metal materials are transition metals, their bonding force to oxygen is weak and, therefore, some reduction damage may occur in processes following formation of an insulating film, by which current leakage is further increased. On the other hand, metal silicate films have significantly lower relative dielectric constants than metal oxide films. However, it is known that since they contain silicon oxides, metal silicate films are thermally more stable and have higher crystallization temperatures than films of a metal oxide alone, thereby allowing for low current leakage (for example, see Patent Literature 3). Furthermore, silicon binds to oxygen with a strong bonding force and is highly resistant to reduction damage. Therefore, transition metal silicate films are expected to improve damage resistance.

As for problems with High-k materials, metal oxide films as a capacitive insulating film have poor insulation properties and damage resistance and metal silicate films have significantly low relative dielectric constants. Films of High-k materials are generally formed by ALD (atomic layer deposition), sputtering, CVD (chemical vapor deposition), and the like. The above problems occur in any of the formation methods. Therefore, extensive efforts have been made to develop a High-k insulating film exhibiting low current leakage properties while maintaining a high relative dielectric constant. Patent Literature 1 to 3 below disclose techniques relating to the present invention.

Patent Literature 1 describes a method of realizing a low leak insulating film by preventing oxygen defects occurring in the electrode/insulating film interface. An antioxidant film and an insulating film are successively formed by ALD without exposing to the atmosphere after a lower electrode is formed, by which the insulating film is formed on a clean underlying layer surface, preventing oxygen defects from occurring in the electrode/insulating film interface. With the oxygen defects being significantly reduced without crystallization, a low leak metal oxide film having a high relative dielectric constant can be realized.

Patent Literature 2 describes a method using an alloyed metal oxide film for preventing oxygen defects occurring in High-k insulating films. Two materials are mixed by ALD to form an alloyed metal oxide film (for example, a TaTiO film), by which crystallization in an oxide film is prevented as in a metal silicate film and oxygen defects in a High-k insulating film can be prevented by heat treatment. Using metals having high relative dielectric constants, low current leakage properties can be realized without lowering the dielectric constant.

Patent Literature 3 describes a method of realizing high capacitance while preventing oxygen defects by manipulating the distributions of silicon and metal in the thickness direction of a metal silicate film. A metal silicate film is formed in the manner that the silicon composition ratio is higher than the metal composition ratio near the interface compared with in the inner part in the thickness direction of the metal silicate film, by which the metal silicate film is nearly a silicon oxide film (SiO$_2$) and is highly insulating near the interface where current leakage is rate-controlled. The metal silicate film is nearly a metal oxide film and has a high relative dielectric constant in the inner part. Therefore, a High-k insulating film having a higher insulation property and a higher relative dielectric constant than conventional metal silicate films can be realized.

Patent Literature 1: Unexamined Japanese Patent Application KOKAI Publication No. 2007-129190;
Patent Literature 2: Unexamined Japanese Patent Application KOKAI Publication No. 2001-053254; and
Patent Literature 3: Unexamined Japanese Patent Application KOKAI Publication No. 2006-054382.

DISCLOSURE OF INVENTION

However, the above Patent Literature 1 to 3 have the following problems.

In Patent Literature 1, the lower electrode and capacitive insulating film are successively formed so as to prevent oxygen defects. However, oxydation gas is used in a high temperature chamber for forming a film by ALD. Therefore, an unexpected oxide film is formed on the lower electrode surface, causing oxygen defects. Furthermore, a single film of metal oxide (particularly transition metal oxide) is subject to process (reduction) damage during formation of an upper electrode film or during etching, causing new oxygen defects in an insulating film. Then, leakage paths are increased and current leakage is significantly increased.

Patent Literature 2 uses metals having high relative dielectric constants as an alloy to realize high capacitance and low leak compared to a single film of metal oxide. Composed of only metal oxides, poor reduction damage resistance is observed. Furthermore, oxygen defects occurring in the electrode/insulating film interface is not taken care of. Therefore, oxygen defects occur in the insulating film and current leakage is significantly increased as in Patent Literature 1.

In Patent Literature 3, the silicon/metal composition ratio is adjusted to prevent the relative dielectric constant from being lowered by silicate. However, the silicon composition ratio should be increased both at the upper interface and at the lower interface of the film in order to realize low current leakage properties. The entire film is silicated and the relative dielectric constant is significantly lowered compared with a single film of metal oxide.

The present invention is proposed to solve the above problems and provides a semiconductor device comprising a capacitive element having high capacitance and low current leakage between the electrodes and a production method thereof.

The present invention provides a semiconductor device comprising a capacitive element having an upper electrode; a capacitive insulating film containing an oxide and/or silicate of a transition metal element; and a lower electrode having a polycrystalline conductive film composed of a material having higher oxidation resistance than the transition metal element and an amorphous conductive film or conductive film having finer crystal than the polycrystalline conductive film, which is formed below the polycrystalline conductive film.

The present invention provides a semiconductor device production method comprising the following steps: forming a transition metal film; irradiating the surface of the transition metal film with mono-silane gas to form a silicon-containing transition metal film; and oxidizing the silicon-containing transition metal film by oxygen plasma treatment.

The semiconductor device of the present invention has a capacitive element undergoing little reduction in dielectric constant or little current leakage between the upper and lower electrodes, improving the efficiency of the semiconductor device.

The semiconductor device production method of the present invention can easily form a transition metal silicate film in which the silicon composition ratio is lowered stepwise towards the bottom and produces an insulating film preferably used particularly in a capacitive element for which low current leakage is desired.

The above and other purpose, characteristics, and benefits of the present invention will be apparent from the explanation below with reference to the drawings.

BRIEF DESCRIPTION OF DRAWINGS

FIG. 6 A graphical representation and photograph showing the EELS composition analysis results on the lower electrode surface of the capacitive element in the semiconductor device in FIG. 1;

FIG. 14 Cross-sectional views showing production processes of the capacitive element in the semiconductor device according to Embodiment 6 of the present invention in sequence;

BEST MODE FOR CARRYING OUT THE INVENTION

Embodiments of the present invention will be described hereafter with reference to the drawings.

Embodiment 1

Figure 1:
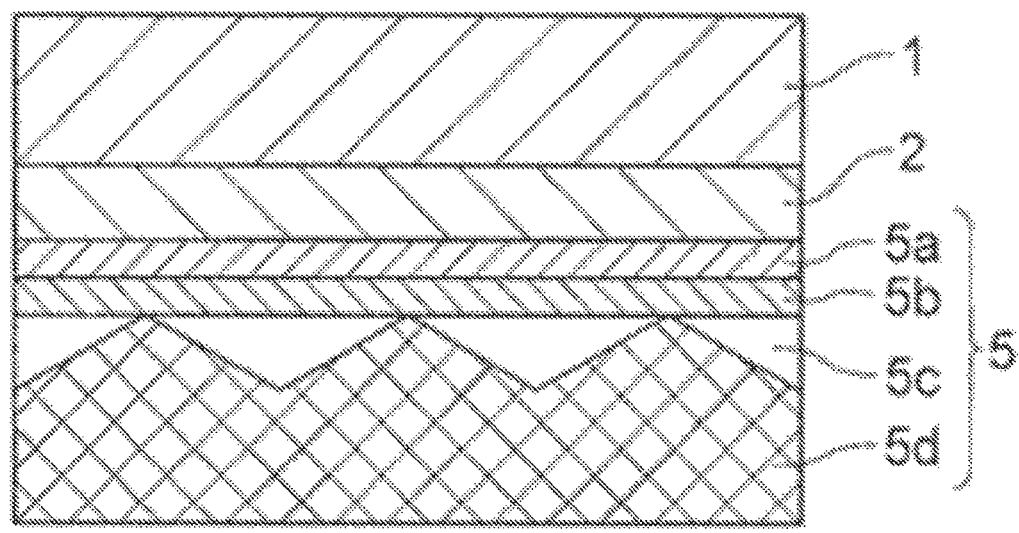
FIG. 1 A cross-sectional view showing the basic structure of the capacitive element in the semiconductor device according to Embodiment 1 of the present invention.

FIG. 1 is a cross-sectional view of the capacitive element in the semiconductor device according to Embodiment 1 of the present invention. The capacitive element includes an upper electrode film 1, a capacitive insulating film 2, and a lower electrode film 5. The lower electrode 5 is composed of a laminated film consisting of, for example, a thin titanium nitride film 5*a*, a tantalum nitride film 5*b*, a tantalum film 5*c*, and a titanium nitride film 5*d*. The capacitive insulating film 2 laminated on the lower electrode is composed of a tantalum oxide film or tantalum silicate film formed by plasma oxidation. Other examples of the plasma oxidized film include a film containing as the main constituent an oxide of any one or multiple metals among zirconium, hafnium, niobium, titanium, tungsten, cobalt, molybdenum, vanadium, lanthanum, manganese, chrome, yttrium, and praseodymium.

Figure 2:
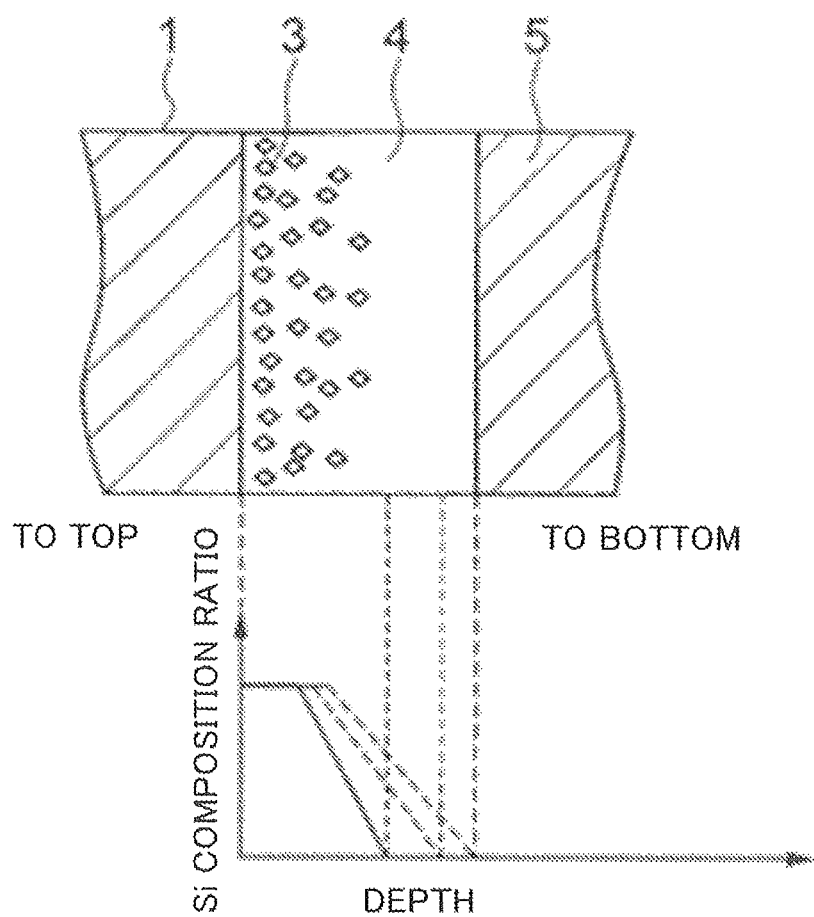
FIG. 2 A cross-sectional view showing the basic structure of the capacitive insulating film in the semiconductor device in FIG. 1.

FIG. 2 shows the Si composition profile in the capacitive insulating film of Embodiment 1. In this figure, the capacitive insulating film in FIG. 1 is formed using a transition metal silicate film 4. The silicon composition ratio in the transition metal silicate film 4 is lowered stepwise in the thickness direction from the top to bottom. The silicon composition ratio is presented by the number of silicon elements in relation to the total number of transition metal elements and silicon elements. The transition metal silicate film 4 can have a silicon composition ratio of 0% at the interface with the lower electrode. The upper electrode film 1 is composed of, for example, a titanium nitride film. The lower electrode film 5 can be composed of any one of a titanium nitride film, tantalum film, tantalum nitride film, and nitrogen-containing tantalum film or a laminated film of these materials as long as the titanium nitride film is in contact with the capacitive insulating film.

A production method for realizing the profile shown in FIG. 2 is as follows. First, a lower electrode 5 of the capacitive element is formed. Then, a transition metal film 6 is formed on the lower electrode 5. The transition metal film 6 is plasma-oxidized to form a transition metal silicate film 4. Subsequently, an upper electrode 1 is formed on the capacitive insulating film.

The transition metal silicate film is formed by plasma oxidation. As shown in Table 1, when TiN is used as the polycrystalline conductive film in contact with the capacitive insulating film and Ta is the transition metal to be plasma-oxidized, only Ta can selectively be oxidized in accordance with the free energy necessary for oxidation. In other words, oxygen defects in the lower electrode interface is prevented without forming any antioxidant film or silicates and therefore the capacitive dielectric film has low current leakage. The lower electrode surface is not protected from oxidation gas when ALD or sputtering is used to form a film; then, the lower electrode surface layer could be unexpectedly oxidized.

Figure 5:
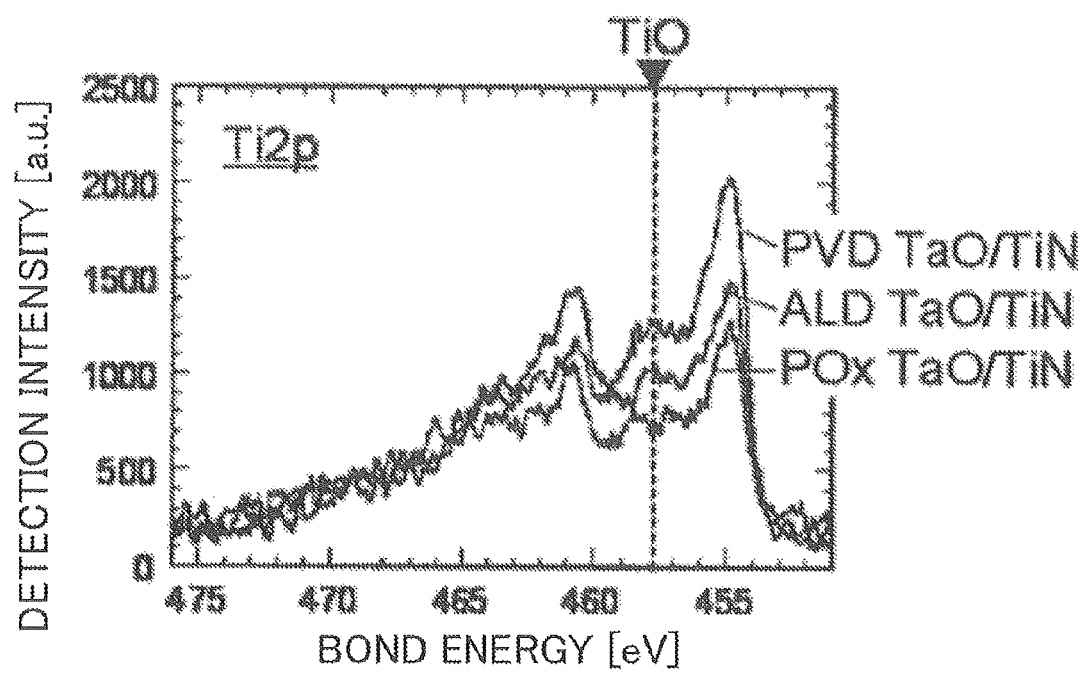
FIG. 5 A graphical representation showing superiority of the production method of the capacitive insulating film in the semiconductor device in FIG. 1.

FIG. 5 shows the spectra obtained for the interface between the capacitive insulating film (tantalum oxide film (TaO) in this case) and TiN lower electrode by XPS (X-ray photoelectron spectroscopy). The surface layer of the TiN lower electrode is oxidized in ALD or sputtering, which causes oxygen defects and increased leak. It can be seen that the TiN lower electrode surface is oxidized very little in the case of plasma oxidation.

Furthermore, detail analysis by EELS (electron energy-loss spectroscopy) in FIG. 6 also revealed no surface oxidation of the TiN lower electrode in the case of plasma oxidation. In other words, a polycrystalline conductive film composed of a material having oxidation resistance higher than that of the transition metal film is used as the surface layer and the transition metal on the lower electrode having the polycrystalline conductive film is plasma-oxidized. In this way, oxygen defects in the lower electrode/capacitive insulating film interface are prevented, and low current leakage properties can be maintained.

Figure 4:
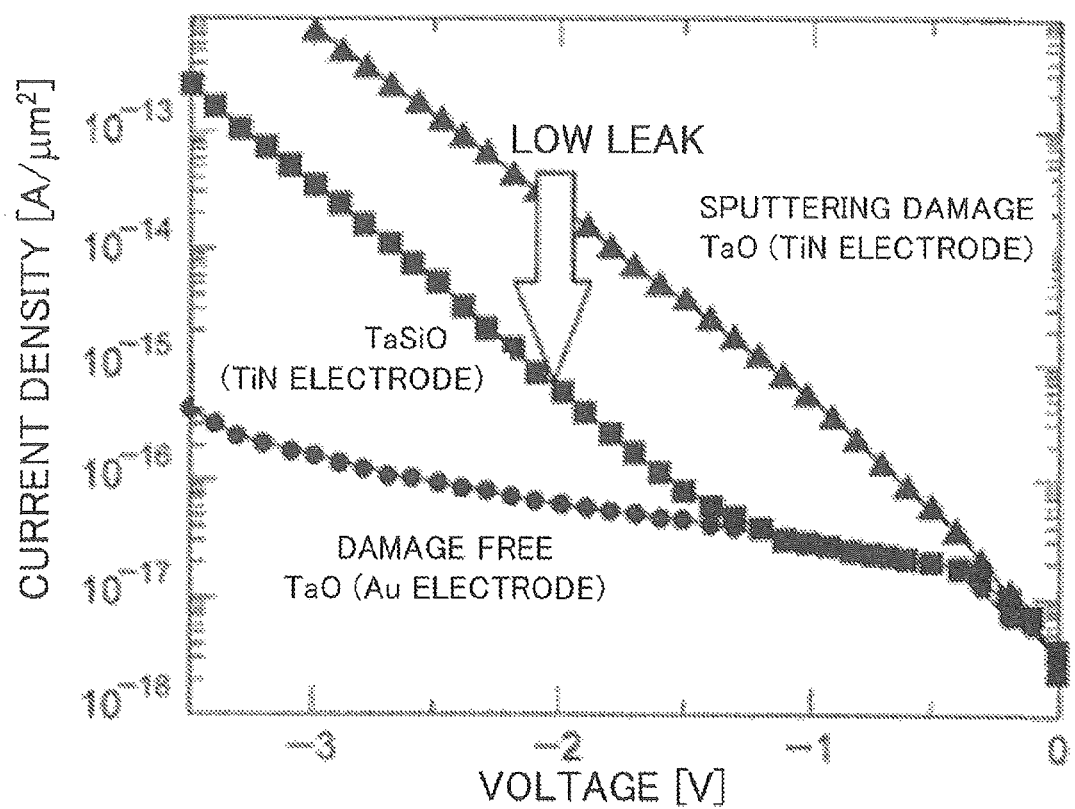
FIG. 4 A graphical representation showing high resistance effect of the capacitive insulating film in the semiconductor device in FIG. 1.

Consequently, transforming only the upper part to silicate is effective for producing a low leak capacitive element (see FIG. 4).

TABLE 1

| Substance | $-\Delta H$ (kcal/mol) | $\Delta S$ (cal/deg-mol) | Reaction | $\Delta G$ (kcal/mol) |
|---|---|---|---|---|
| Ti | 0 | 7.32 | TiN + O (g) → TiO + N | −69 |
| TiN | 80.4 | 7.24 | Ta + O (g) → TaO | −90 |
| $TiO_2$ (rutile) | 225.5 | 12.0 | | |
| Ta | 0 | 9.92 | | |
| TaN | 60.0 | 12.2 | | |
| TaO | 489.0 | 34.2 | | |
| $N_2$ | 0 | 45.8 | | |
| $O_2$ | 0 | 49.0 | | |

In order to prevent the occurrence of oxygen defects in the lower electrode/capacitive insulating film interface, the transition metal should be oxidized uniformly up to the lower electrode interface neither too much nor too little by plasma oxidation. To do so, the transition metal should have a crystalline structure easy to be oxidized and the lower electrode should have a flat surface. For example, in the case of materials in Table 1, the transition metal is Ta and the lower electrode is TiN. It is preferable that the crystalline structure of Ta is a β-Ta film allowing oxygen to easily diffuse at a low density or an α-β mixed crystal system film having a relatively high content of β-Ta.

Figure 7:
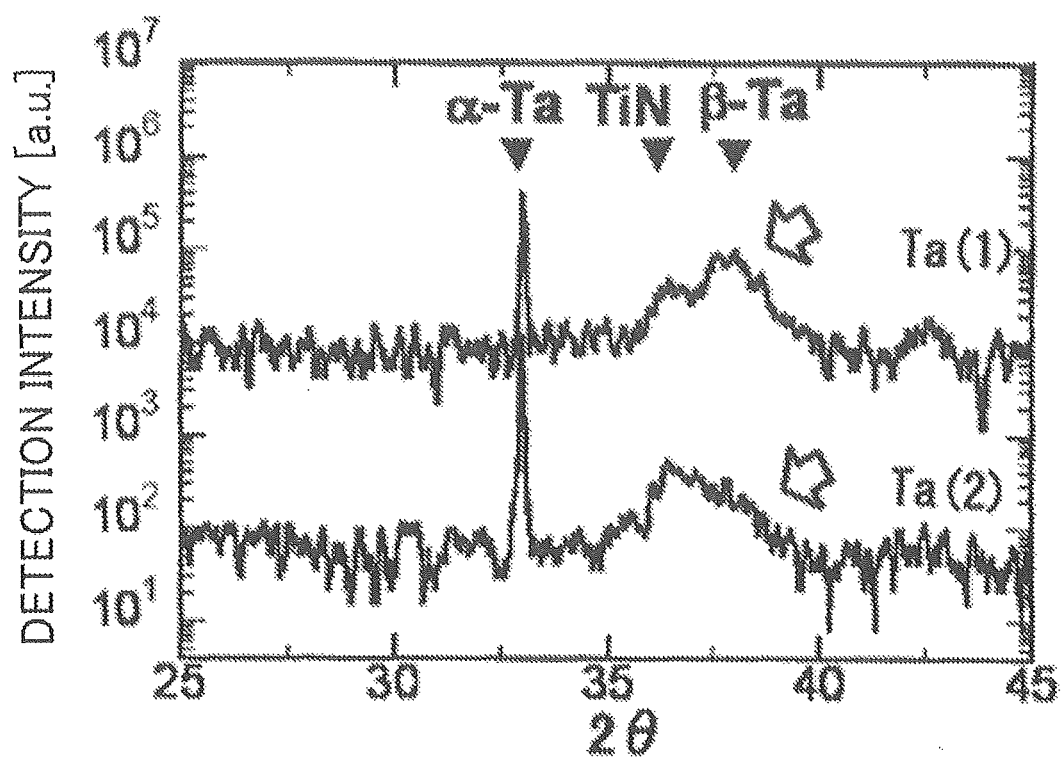
FIG. 7 A graphical representation showing the X-ray analysis results of the crystalline structure of the tantalum film in FIG. 1.

For example, in the profile shown in FIG. 7 that is obtained by XRD (X-ray diffraction), the spectrum of Ta (1) has a large, broad peak for n-Ta than the spectrum of Ta (2), indicating a low density crystalline structure. Therefore, Ta (1) is a Ta film more suitable for plasma oxidation. On the other hand, TiN is highly resistant to oxidation. However, it is a polycrystalline conductive film and its surface roughness is increased as the film thickness is increased. Then, the reliability of a capacitive element is deteriorated. It is preferable to flatten the TiN film surface in order to prevent such deterioration in reliability. The TiN surface can be flattened by forming an amorphous form or microcrystalline form of Ta or TaN or a laminated film of these (which is termed Ta (N), hereafter) on the TiN. A lamination structure TiN/Ta (N)/TiN is used because of this ability of flattening and in order to maintain the oxidation resistance of the electrode surface. With the outermost TiN film having a small thickness, the flatness is maintained and the thickness of the entire electrode can be maintained at a specific thickness or larger.

Figure 8:
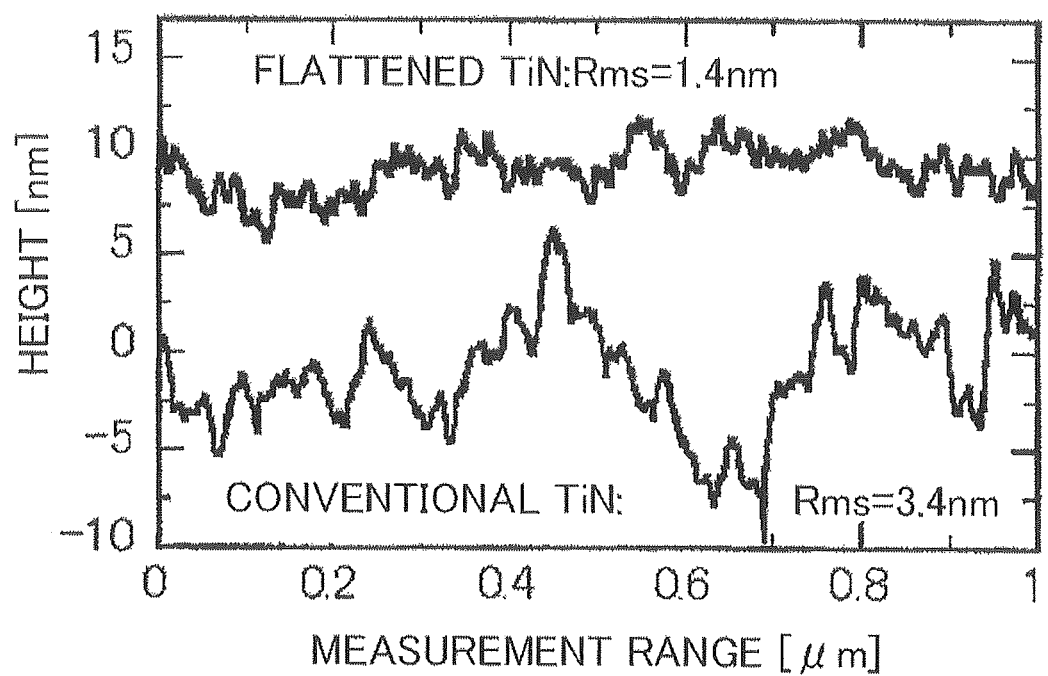
FIG. 8 A graphical representation showing the flatness of the lower electrode surface of the MIM capacitive element in FIG. 1.
Figure 9:
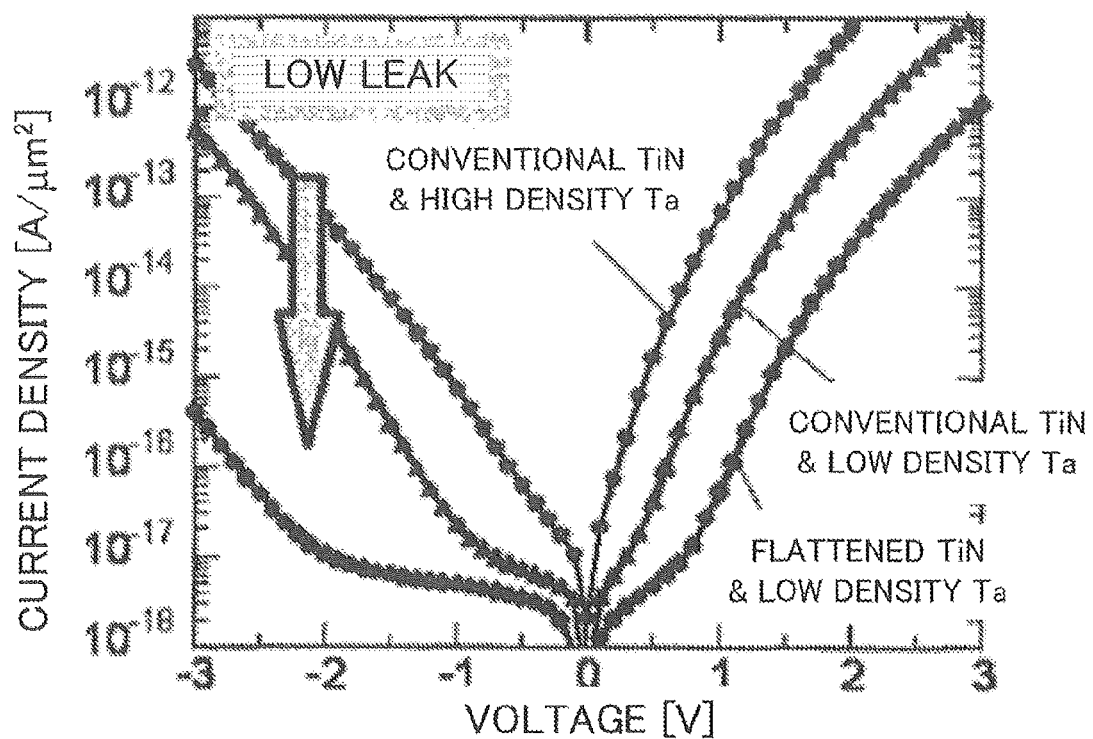
FIG. 9 A graphical representation showing low leak effect of the MIM capacitive element in FIG. 1.

As shown in the cross-sectional profile in FIG. 8, the surface roughness of the flattened TiN electrode is approximately ⅓ of conventional TiN. The TiN can be flattened by CMP (chemical mechanical polishing). Using the low density transition metal and flattened lower electrode, uniform oxidation can be achieved and a low leak MIM as shown in FIG. 9 can be realized. Here, Ta (N) and thin TiN are successively laminated on thick TiN. A two-layer structure can also be used in which thin TiN is laminated on a thick Ta (N) electrode. What is important is that the uppermost layer of the lamination structure composing the lower electrode is a thin TiN and Ta (N) is present in the underlying layer.

The process of producing the above structure is characterized by the step of forming the transition metal silicate film 4 described above, which will be described in detail hereafter. In this embodiment, the transition metal silicate film 4 is formed using a not-shown plasma CVD device. The plasma CVD device can produce plasma on a target based on CVD techniques and is capable of plasma oxidation. The plasma CVD device also has a heater so that it can apply 350° C. or higher temperatures to the substrate.

Figure 3:
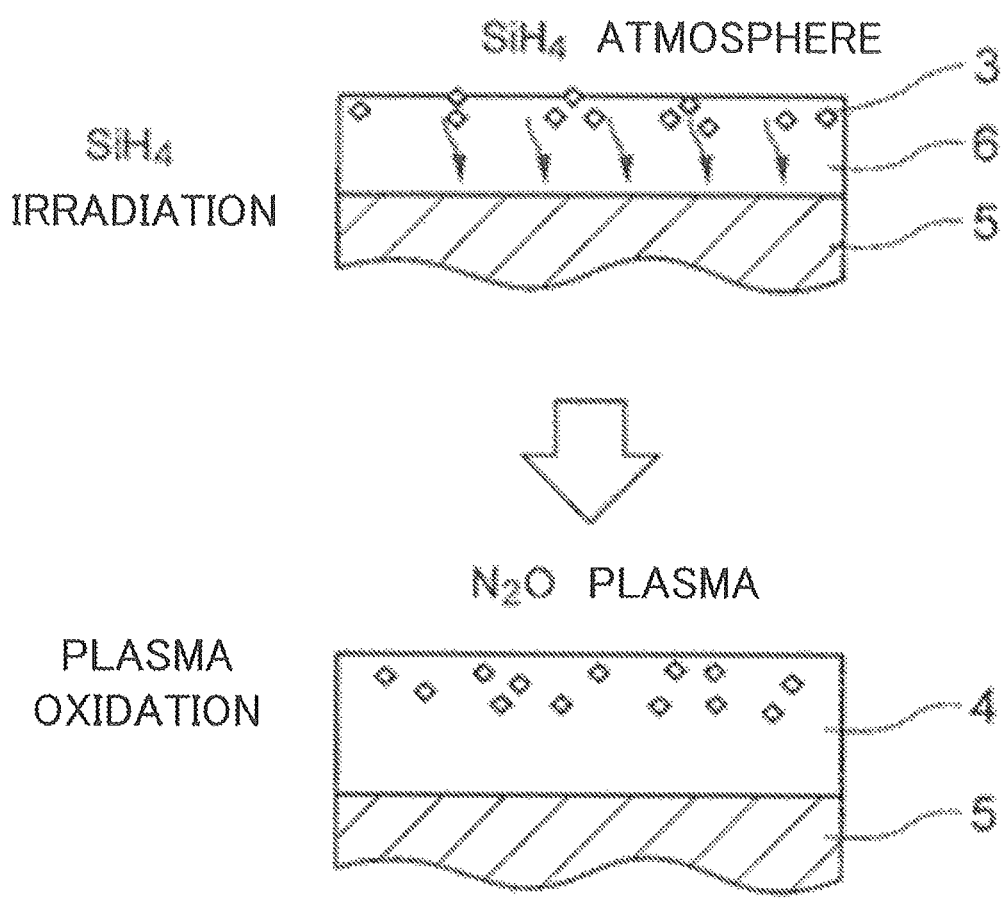
FIG. 3 Cross-sectional views showing a production flow of the capacitive insulating film in the semiconductor device in FIG. 1.

FIG. 3 schematically shows the step of forming a transition metal silicate film 4 by plasma oxidation. First, a lower electrode 5 is formed on a multilayer wire having a not-shown CMOS. Then, a transition metal film 4 is formed on the lower electrode 5, which is introduced in the chamber of a plasma CVD device. Subsequently, the surface of the transition metal film 6 is irradiated with mono-silane (SiH) gas in the plasma CVD device to add Si into the transition metal film 4. The Si-containing transition metal film 6 is plasma-oxidized to form a transition metal silicate film. The transition metal silicate film is used as the transition metal silicate film 4. The electrode and transition metal film can be formed by sputtering or CVD.

When the Si-containing transition metal film 6 is plasma-oxidized to form a transition metal silicate film 4, cubical expansion occurs during the plasma oxidation. Therefore, the transition metal silicate film is larger in thickness than the transition metal film 6. Then, Si atoms migrate to the upper part of the transition metal silicate film because of sink effect. Therefore, the silicon composition ratio is lowered stepwise in the thickness direction of the transition metal silicate film from the top to bottom. As shown in FIG. 1, the silicon composition ratio in the transition metal silicate film can be controlled for composition ratios suitable for applications by changing mono-silane gas irradiation conditions.

Transition metal oxide films have a relative dielectric constant of approximately 15 to 50. With silicon being introduced, the relative dielectric constant is lowered according to the content of silicon. In order for a transition metal oxide having a relative dielectric constant of 15 to maintain a relative dielectric constant of 10 or higher after silicon is introduced, the silicon composition ratio to the total number of transition metal elements and silicon elements should be 50% or lower.

In this embodiment, the transition metal film 6 and transition metal silicate film 4 are, for example, a Ta film and TaSiO film. The Ta film is irradiated with mono-silane gas in a plasma CVD device, for example, at a flow rate ratio of 15% to inert gas under the temperature conditions of 2.5 torr, 350° C. so as to form a Si-containing Ta film. The Si-containing Ta film is oxidized by plasma oxidation to form a TaSiO film. The gas used in the oxidation is, for example, $N_2O$ gas.

TaO has a relative dielectric constant of 20. With silicon being introduced, the relative dielectric constant is lowered according to the content of silicon. In order to maintain a relative dielectric constant of 10 or higher after silicon is introduced, the silicon composition ratio to the total number of Ta elements and silicon elements should be 60% or lower.

Embodiment 2

Figure 10:
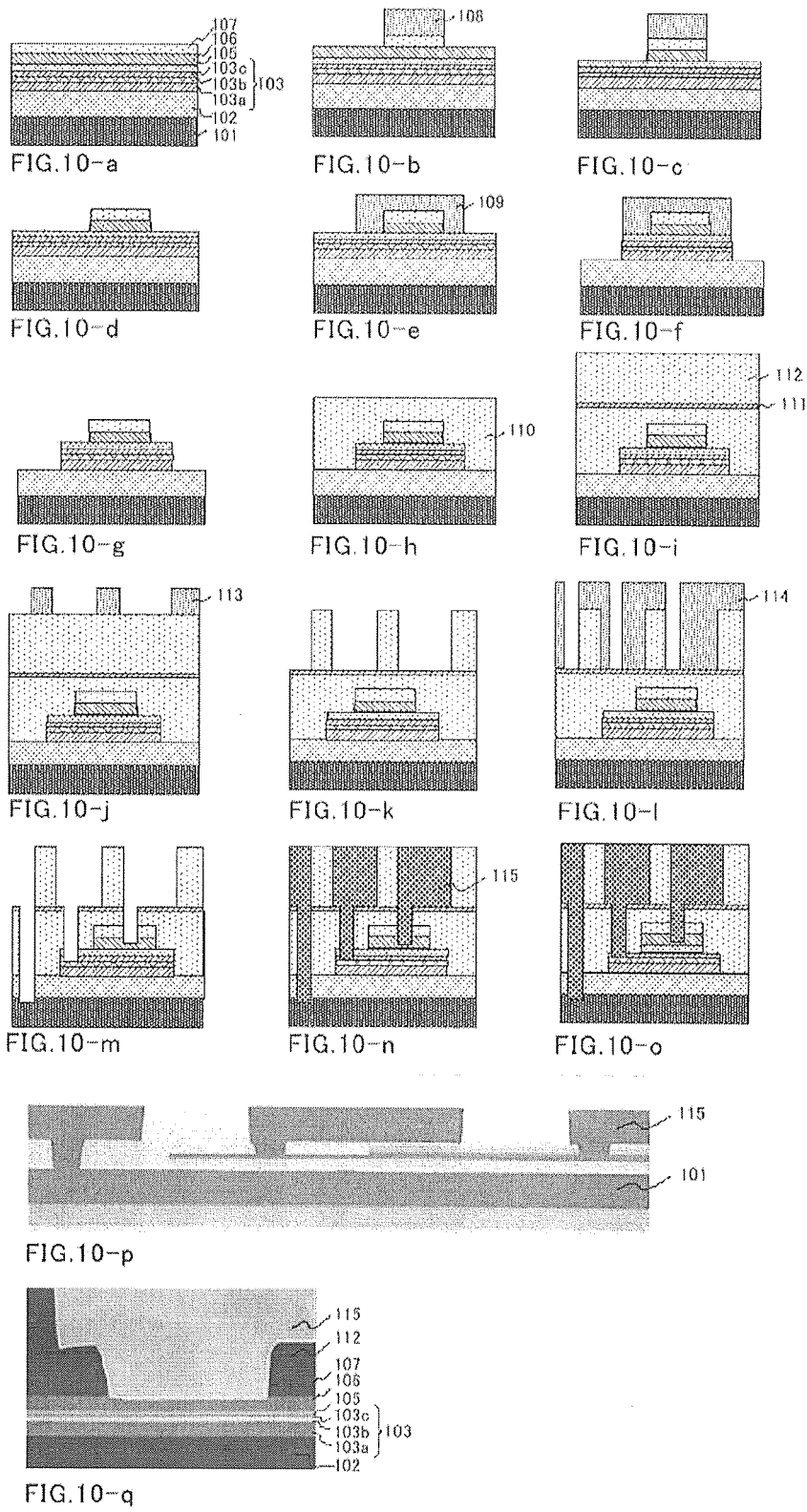
FIG. 10 Cross-sectional views showing production processes of the capacitive element in the semiconductor device according to Embodiment 1 of the present invention in sequence.

The capacitive element of the semiconductor device of Embodiment 2 has an MIM structure installed in an actual ULSI wiring structure as shown in FIG. 10 (10-a to 10-o). In a production process, first, a silicon oxide film 102 of 400 nm in thickness is formed on an underlying wire 101 by plasma CVD. Then, a polycrystalline titanium nitride film 103a of 100 nm in thickness, a microcrystalline tantalum film 103b of 30 nm in thickness, and a polycrystalline titanium nitride film 103c of 15 nm in thickness are sequentially formed as a lower electrode. A tantalum film 104 of 3 to 10 nm in thickness is formed thereon as a transition metal film. Then the tantalum film 104 is plasma-oxidized to form a tantalum oxide film, namely a capacitive insulating film 105. Here, the tantalum film 104 is desirably β-tantalum or an α-β mixed crystal system film containing a relatively large amount of β-tantalum. No inconvenience occurs even if the lower electrode has a two-layer structure composed of a microcrystalline tantalum film 103b and a polycrystalline titanium nitride film 103c. A titanium nitride film 106 of 100 nm in thickness as an upper electrode film and a silicon nitride film 107 of 250 nm in thickness as an upper electrode etching stopper are formed (FIG. 10-a). The lower electrode 103 can be a CMP-treated titanium nitride film and the capacitive insulating film 105 can be a tantalum silicate film. The titanium nitride film 103, tantalum film 104, titanium nitride film 106, and silicon nitride film can be formed, for example, by deposition using sputtering or CVD.

Then, a photoresist 108 is patterned for tailoring the upper electrode to a desired size as shown in FIG. 10-b. Then, the silicon nitride film 107 and titanium nitride film are etched using the photoresist 108 as shown in FIG. 10-c. Subsequently, the post-etching photoresist 108 is removed as shown in FIG. 10-d. Then, a photoresist 109 is pattered for forming a lower electrode having a desired size as shown in FIG. 10-e. Here, the photoresist 109 is patterned to cover the upper electrode 6. Then, the tantalum silicate film 105 and titanium nitride film 103 are etched using the photoresist 109 as shown in FIG. 10-f. Subsequently, the post-etching photoresist 109 is removed as shown in FIG. 10-g.

Then, a silicon oxide film 110 of 1200 nm in thickness, which will be an inter-via layer film, is formed on the front surface by plasma CVD to cover the MIM structure and treated by CMP to eliminate any steps (FIG. 10-h). A silicon carbonitride film 110 of 120 nm in thickness as a trench stopper is formed by plasma CVD and then a silicon oxide film 112 of 1200 nm in thickness as an inter-trench layer film is formed by plasma CVD (FIG. 10-i). Subsequently, a photoresist 113 is applied and patterned to desired upper wire width as shown in FIG. 10-j.

The silicon oxide film 112 is plasma-etched using fluorocarbon gas and the photoresist 111 is removed (FIG. 10-k). A photoresist 114 is applied to cover the upper wire pattern, which is patterned to desired upper vias (FIG. 10-1). The silicon carbonitride film 111 and silicon oxide film 110 are plasma-etched using fluorocarbon gas and then the photoresist 114 is removed (FIG. 10-m).

Subsequently, a barrier film and a copper film are filled in the trench and vias and polished by CMP to form contacts between the upper and lower wires and an MIM structure that provides contacts on the upper wire (FIG. 10-n).

Furthermore, in the above embodiment, as shown in FIG. 10-o, no inconvenience occurs in an MIM structure in which the capacitive insulating film 105 is etched at the same time as the titanium nitride film 106 is etched. FIGS. 10-p and 10-q show actual cross-sectional views.

Embodiment 3

Figure 11:
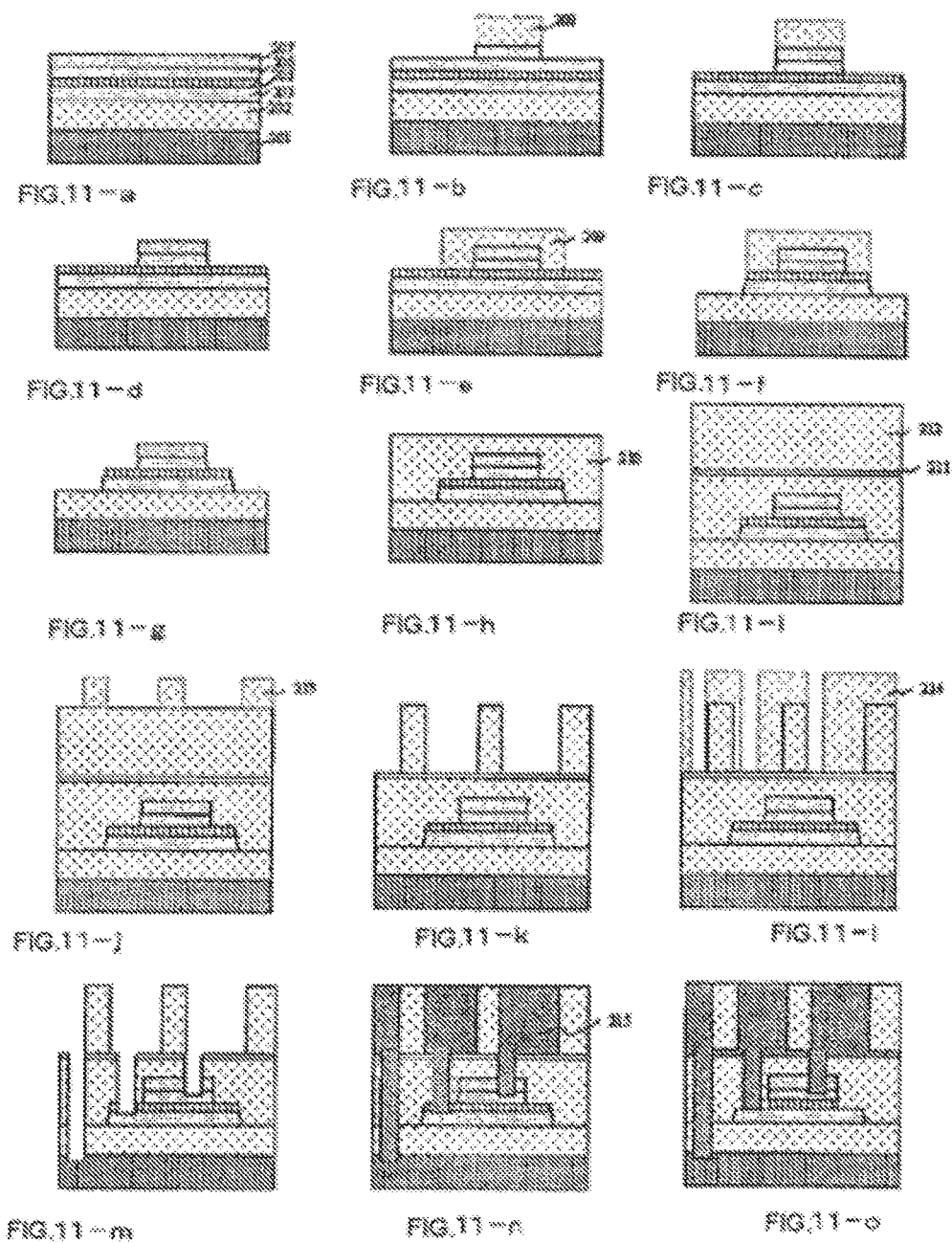
FIG. 11 Cross-sectional views showing production processes of the capacitive element in the semiconductor device according to Embodiment 2 of the present invention in sequence.

The capacitive element of the semiconductor device according to Embodiment 2 has an MIM structure installed in an actual ULSI wire structure as shown in FIG. 11 (11-a to 11-o).

In a production process, first, a silicon oxide film 202 of 400 nm in thickness is formed on a lower wire 201 by plasma CVD. A polycrystalline titanium nitride film 203 of 140 nm in thickness as a lower electrode and a tantalum film 204 of 3 to 10 nm in thickness as a transition metal film are formed. Then, the tantalum film 204 is irradiated with mono-silane gas to add silicon to it and then plasma-oxidized to form a tantalum silicate film 205. Here, the tantalum film 204 is desirably a β-tantalum or an α-β mixed crystal system film containing a large amount of β-tantalum. A titanium nitride film 206 of 100 nm in thickness as an upper electrode film and a silicon nitride film 207 of 250 nm in thickness as an upper electrode etching stopper are formed (FIG. 11-a). The lower electrode 203 can be a CMP-treated titanium nitride film or a two or more layer laminated film composed of titanium nitride and tantalum films. The titanium nitride film 203, tantalum film 204, titanium nitride film 206, and silicon nitride film can be formed, for example, by deposition using sputtering or CVD.

Then, a photoresist 208 is patterned for tailoring the upper electrode to a desired size as shown in FIG. 11-b. Then, the silicon nitride film 207 and titanium nitride film are etched using the photoresist 208 as shown in FIG. 11-c. Subsequently, the post-etching photoresist 208 is removed as shown in FIG. 11-d. Then, a photoresist 209 is patterned for forming a lower electrode having a desired size as shown in FIG. 11-e. Here, the photoresist 209 is patterned to cover the upper electrode 6. Then, the tantalum silicate film 205 and titanium nitride film 203 are etched using the photoresist 209 as shown in FIG. 11-f. Subsequently, the post-etching photoresist 209 is removed as shown in FIG. 11-g.

Then, a silicon oxide film 120 of 1200 nm in thickness, which will be an inter-via layer film, is formed on the front surface by plasma CVD to cover the MIM structure and treated by CMP to eliminate any steps (FIG. 11-h). A silicon carbonitride film 210 of 120 nm in thickness as a trench stopper is formed by plasma CVD and then a silicon oxide film 212 of 1200 nm in thickness as an inter-trench layer film is formed by plasma CVD (FIG. 11-i). Subsequently, a photoresist 213 is applied and patterned to desired upper wire widths as shown in FIG. 11-j. The silicon oxide film 212 is plasma-etched using fluorocarbon gas and the photoresist 211 is removed (FIG. 11-k).

A photoresist 214 is applied to cover the upper wire pattern, which is patterned to desired upper vias (FIG. 11-1). The silicon carbonitride film 211 and silicon oxide film 210 are plasma-etched using fluorocarbon gas and then the photoresist 214 is removed (FIG. 11-m).

Subsequently, a barrier film and a copper film are filled in the trench and vias and polished by CMP to form contacts between the upper and lower wires and an MIM structure that provides contacts on the upper wire (FIG. 11-n). Then, as shown in FIG. 11-o, no inconvenience occurs in an MIM structure in which the tantalum silicate film 205 is etched at the same time as the titanium nitride film 206 is etched. The above-described tantalum silicate film can be, for example, the tantalum silicate film 3 described with reference to FIG. 1.

Embodiment 4

One of the production methods for realizing the MIM structure of Embodiment 4 of the present invention uses a hard mask film. Such production process will be described with reference to FIG. 12 (12-a to 12-r).

Figure 12:
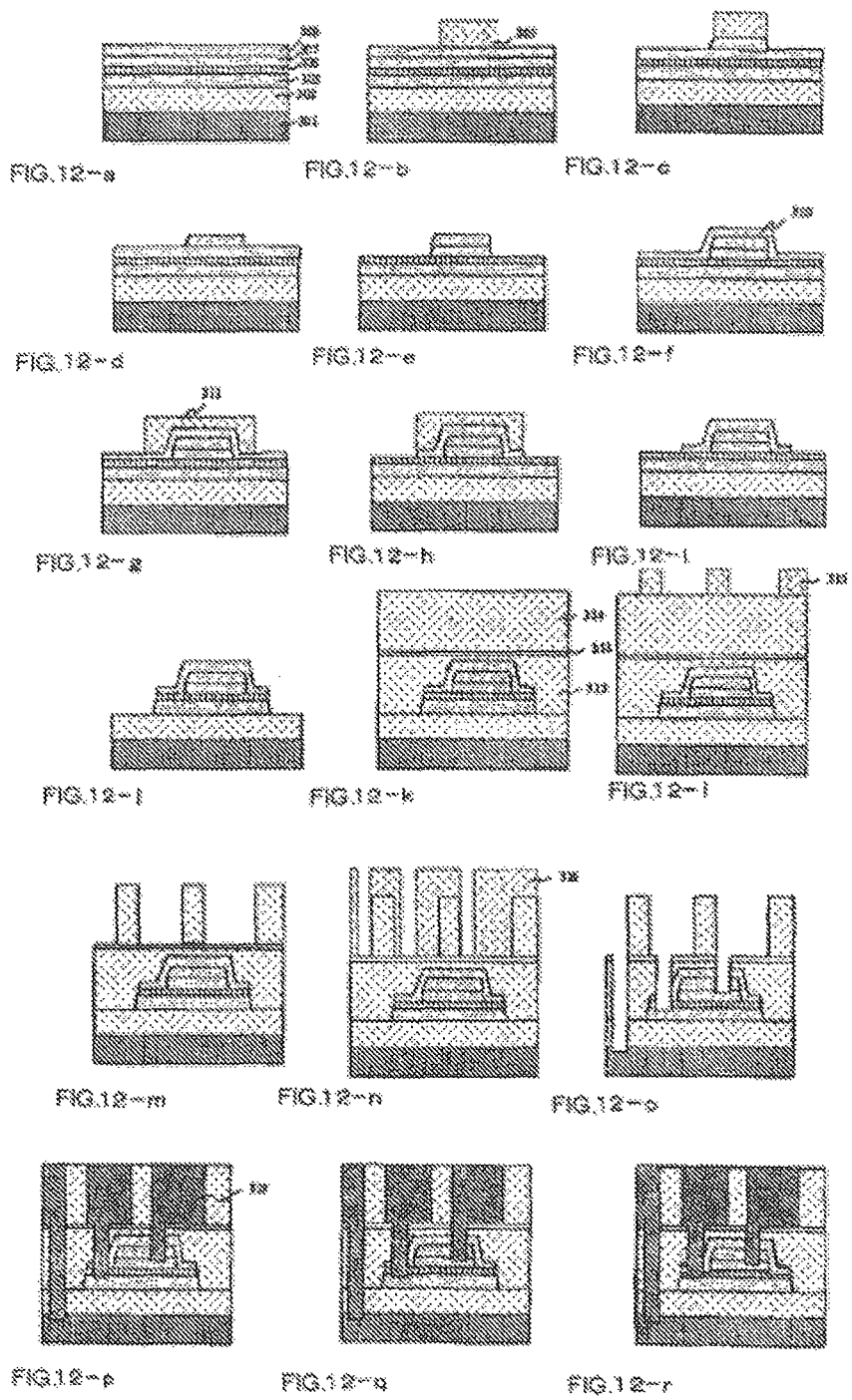
FIG. 12 Cross-sectional views showing production processes of the capacitive element in the semiconductor device according to Embodiment 4 of the present invention in sequence.

In a production process, first, in the same matter as in FIG. 11-a, a silicon oxide film 302 of 400 nm in thickness is formed on a lower wire 301 by plasma CVD. A titanium nitride film 303 of 140 nm in thickness as a lower electrode and a tantalum film 304 of 5 nm in thickness as a transition metal film are formed. Then, a silicon-containing tantalum film 305 formed by irradiation of mono-silane gas is plasma-oxidized to form a tantalum silicate film 306. Here, the tantalum silicate film can be, for example, the tantalum silicate film 3 described with reference to FIG. 1. A titanium nitride film 307 of 100 nm in thickness as an upper electrode film is formed. Furthermore, a silicon nitride film 308 of 100 nm in thickness as a hard mask film is formed by plasma CVD (FIG. 12-a). In this embodiment, the lower electrode can be a CMP-treated titanium nitride film or a two or more layer laminated electrode film composed of titanium nitride and tantalum films. The relationship between the hard mask film 308 and upper electrode film 307 is such that the upper electrode film 307 is made of a material that is not easily etched while the hard mask film 308 is etched and, conversely, the hard mask film 308 is made of a material that is not easily etched while the upper electrode film 307 is etched.

Then, a photoresist 309 is patterned for tailoring the upper electrode to a desired size as shown in FIG. 12-b. Then, the silicon nitride film 308 is etched using the photoresist 309 as shown in FIG. 12-c. Subsequently, the post-etching photoresist 309 is removed as shown in FIG. 12-d. Then, the titanium nitride film 307 is etched using the silicon nitride film 308 as shown in FIG. 12-e. Using a hard mask film in the tailoring prevents an abnormal shape, so-called fence, even in the case that adhesion of the etching product occurred to the sidewall as the etching goes not only into the tantalum silicate film 306 but also into the titanium nitride film 303 during the etching of the titanium nitride film 307. Furthermore, the silicon nitride film 308 of the hard mask film also serves as the stopper in a subsequent via etching step.

Then, a silicon nitride film 310 as a hard mask film is formed on the entire surface as shown in FIG. 12-f. The relationship between the hard mask film 310 and lower electrode films 303 and 304 is such that the lower electrode films 303 and 304 are made of a material that is not easily etched while the hard mask film 310 is etched and, conversely, the hard mask film 310 is made of a material that is not easily etched while the lower electrode films 303 and 304 are etched.

Then, a photoresist 311 is patterned for forming a lower electrode having a desired shape as shown in FIG. 12-g. Here, the photoresist 311 is patterned to cover the upper electrode structure. Then, the silicon nitride film 310 is etched using the photoresist 311 as shown in FIG. 12-h. Subsequently, the post-etching photoresist 311 is removed as shown in FIG. 11-i.

Then, the tantalum silicate film 306 and titanium nitride film 303 are sequentially etched using the silicon nitride film 310 as a mask as shown in FIG. 12-j. Using a hard mask in the tailoring fully prevents an abnormal shape, so-called fence, even in the case that adhesion of the etching product occurred to the sidewall during the etching of the tantalum silicate film 306. Furthermore, the silicon nitride film 310 of the hard mask film also serves as the stopper in a subsequent via etching step. Then, a silicon oxide film 312 of 1200 nm in thickness, which will be an inter-via layer film, is formed on the entire surface by plasma CVD to cover the MIM structure and treated by CMP to eliminate any steps.

Furthermore, a silicon carbonitride film 313 of 120 nm in thickness as a trench stopper is formed by plasma CVD and then a silicon oxide film 314 of 1200 nm in thickness as an inter-trench layer film is formed by plasma CVD (FIG. 12-k). Subsequently, a photoresist 315 is applied and patterned to desired upper wire widths as shown in FIG. 12-l.

The silicon oxide film 314 is plasma-etched using fluorocarbon gas and the photoresist 315 is removed (FIG. 12-m). A photoresist 316 is applied to cover the upper wire pattern. The photoresist 316 is patterned to desired upper vias (FIG. 12-n).

The silicon carbonitride film 313 and silicon oxide film 312 are plasma-etched using fluorocarbon gas and then the photoresist 316 is removed (FIG. 12-o). Subsequently, a barrier film and a copper film are filled in the trench and vias and polished by CMP to form contacts between the upper and lower wires and an MIM structure that provides contacts on the upper wire (FIG. 12-p).

In the above embodiment, as shown in FIG. 12-q, no inconvenience occurs in an MIM structure in which the tantalum silicate film 306 is etched at the same time as the upper electrode film 307 is etched.

Furthermore, as shown in FIG. 12-r, no inconvenience occurs in an MIM structure in which the tantalum silicate film 306 is etched at the same time as the hard mask film 310 is etched. Furthermore, no inconvenience occurs in that a single layer of the silicon-containing tantalum film 305 is oxidized by nitrous-oxide ($N_2O$) plasma to form a tantalum nitride silicate film.

Embodiment 5

Figure 13:
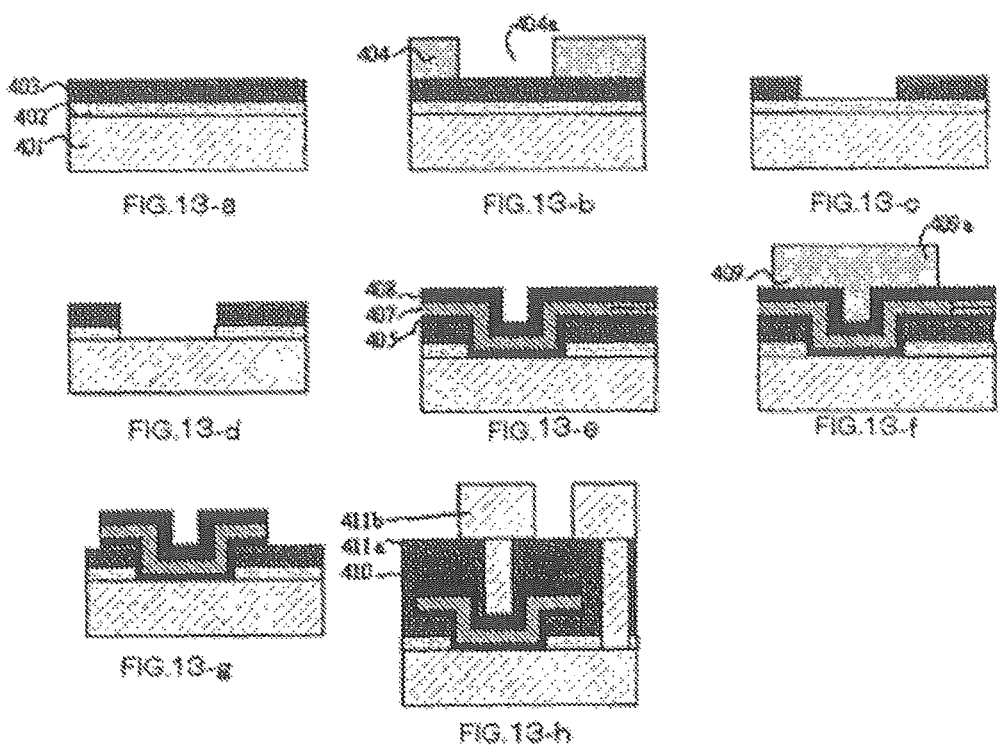
FIG. 13 Cross-sectional views showing production processes of the capacitive element in the semiconductor device according to Embodiment 5 of the present invention in sequence.

The semiconductor device of this embodiment has a lower electrode lining structure in which a capacitive element composed of an upper electrode, a capacitive insulating film, and a lower electrode sequentially laminated in this order from the top is installed on a wire and the lower electrode of the capacitive element makes direct contact with the underlying wire. FIG. 13 (13-a to 13-h) are cross-sectional views of processes for realizing this embodiment. In a production process, first, as shown in FIG. 13-a, an embedded Cu wire 401 is formed. A silicon nitride film or silicon carbonitride film of 100 nm as a wire cap insulating film 402 for preventing oxidation and diffusion of Cu and a $SiO_2$ or SiOCH film of 150 nm as a hard mask 403 are formed.

Then, a photoresist 404 is applied and a pattern 404a for forming a lower electrode contact is formed by photolithography (FIG. 13-b). Subsequently, the silicon oxide film 403 is etched by fluorocarbon plasma using the photoresist in which the lower electrode contact pattern 404a is formed as a mask. In the etching, it is important to stop the etching on the wire cap film 402 utilizing the selectivity of dry etching. After a lower electrode contact pattern is formed in the hard mask, the photoresist is removed by ashing to obtain the configuration in FIG. 13-c. Since the underlying Cu surface is not exposed, the oxidation of Cu by oxygen plasma can be hindered during the ashing.

Then, the wire cap film 402 is etched using the opening pattern of the hard mask 403 as a mask to form an opening pattern reaching the underlying Cu surface as shown in FIG. 13-d.

Subsequently, as shown in FIG. 13-e, a titanium nitride film 405 of 15 to 30 nm in thickness is formed by sputtering to form a lower electrode. The lower electrode can be a single tantalum film layer 405 of 3 to 20 nm in thickness. A silicon-containing tantalum film 406 of 5 nm is formed on the lower electrode and plasma-oxidized to form a tantalum silicate film 407. The tantalum silicate film can be, for example, the tantalum silicate film 3 described with reference to FIG. 1. Then, a titanium nitride film 408 serving as an upper electrode is formed.

A photoresist 409 is applied on the titanium nitride film 408 and an upper electrode pattern 409a enclosing the lower electrode contact region is formed by photolithography (FIG. 13-f). The titanium nitride film 408, tantalum silicate film 407, tantalum film 406, and titanium nitride film 405 are dry-etched in this order using the upper electrode pattern 409a as a mask (FIG. 11-g).

It is preferable to use chlorine/$BCl_3$-based gas for etching the titanium nitride films 405 and 408 and fluorocarbon gas plasma for etching the tantalum oxynitride film 407. Furthermore, the substrate is heated to, preferably, 50 degrees or higher in order to prevent any deposits adhering to the sidewall during the etching of the tantalum-based film 407. After the dry etching, the resist 409 is removed. An insulating film 410 is deposited. An upper via 411a and upper wire 411b are formed to make contact with the capacitive element (FIG. 13-h).

In this embodiment, the silicon-containing tantalum film 406 on the lower electrode is directly formed as the tantalum silicate film 407. Therefore, a low leak capacitive element can be formed, without being influenced from the trench structure.

In this embodiment, the upper and lower electrodes are composed of titanium nitride films. Any material can be used as long as the same effect is obtained. For example, tantalum nitride films, tantalum films, or tungsten-containing laminated films can be used. Even aluminum and their alloys can be used. The lower electrode surface can be flattened by CMP treatment. Furthermore, here the laminated transition metal film is a tantalum film, but any material can be used as long as the same effect is obtained. For example, a niobium film, zirconium film, or hafnium film can be used.

Embodiment 6

In the semiconductor device of this embodiment, a capacitive element composed of an upper electrode, a capacitive insulating film, and a lower electrode sequentially laminated in this order from the top is installed on a wire and the lower electrode of the capacitive element is embedded in a groove opened in an insulating film formed on the underlying wire until it reaches the underlying wire, by which the lower electrode and underlying wire are in direct contact. FIG. 14 (14-a to i) is cross-sectional views of processes for realizing this embodiment.

In a production process, first, as shown in FIG. 14-a, a SiN or SiCN film of 120 nm as a wire cap insulating film 502 for preventing oxidation of the wire and diffusion of the wire material and a $SiO_2$ or SiOCH of 200 nm as a hard mask 503 are formed on a Cu-based lower wire 501.

An opening pattern is formed in the hard mask as shown in FIG. 14-b by photolithography and etching. Here, it is important to stop the etching on the wire cap film 502 utilizing the selectivity of dry etching. After the opening pattern is formed in the hard mask, the photoresist is removed by ashing. Here, since the underlying wire surface is not exposed, the oxidation of the wire by oxygen plasma can be hindered. The wire cap film is etched using the opening pattern in the hard mask as a mask to form an opening pattern reaching the underlying wire surface as shown in FIG. 14-c.

Subsequently, as shown in FIG. 14-d, a TaN film of 600 nm as an embedded plug lower electrode 504a is formed by sputtering to completely fill the opening. Then, any TaN other than in the opening is removed by CMP. Consequently, an embedded lower electrode 504b as shown in FIG. 14-e is formed. Here, the material forming the embedded electrode is not restricted to TaN. Any material having metallic or semiconductor conductivity such as Ta, Ti, W, Al, Cu, Si, and their alloys and nitrides can be used. Here, no problem occurs even if no hard mask film remains and the wire cap film is exposed. The total thickness of the remaining hard mask and wire cap determines the thickness of the lower electrode.

FIG. 14-e shows a case in which the polishing is performed until the wire cap film is exposed. In this way, the formation is achieved in which the embedded lower electrode is in direct contact with the underlying lower wire. When Cu is used as the wire material, it is a soft material and easily undergoes dishing during CMP. A dent may appear in the middle when a large area pattern is used. Therefore, it is difficult to form a Cu wire of a large area pattern. TaN is a hard material and does not easily undergo dishing. Therefore a flat surface can be obtained even if a relatively large area pattern is used.

Then, as shown in FIG. 14-f, a TiN film of 100 nm in thickness as a main lower electrode layer 505 composed of a polycrystalline material and exhibiting metallic conductivity according to the present invention and a Ta film of 5 nm to 10 nm in thickness as a transition metal film 506 on the lower electrode are formed by reactive sputtering. Here, the main lower electrode 505 can be composed of a material having a polycrystalline structure and metallic or semiconductor conductivity. The transition metal film 506 can be composed of a material that forms an oxide having a high dielectric constant, exhibits metallic or semiconductor conductivity, and is differentiated from the lower electrode in oxidation selectivity upon plasma oxidation.

Subsequently, a silicon-containing tantalum film 507 formed by irradiating the Ta film 506 with mono-silane gas is plasma-oxidized to form a tantalum silicate film 508. A TiN film as an upper electrode 509 is formed thereon by reactive sputtering. The same SiN or SiCN film as the insulating film formed on the wire is formed as a capacitive cap insulating film 510 on the upper electrode to complete a capacitive laminated film as shown in FIG. 14-g.

Subsequently, as shown in FIG. 14-h, the capacitive cap film 511, upper electrode 509, tantalum silicate film 508, and lower electrode film 505 are patterned to enclose the lower electrode. For the capacitor patterning, the capacitive cap film 510 is etched using a photoresist as a mask and the remaining multilayer film is etched using the capacitive cap film 510 as a mask after ashing.

After dry etching, an insulating film is deposited and an upper electrode contact 512a, upper via 512b, and upper wire 512c are formed to make contact with the capacitive element (FIG. 14-i).

Embodiment 7

Figure 15:
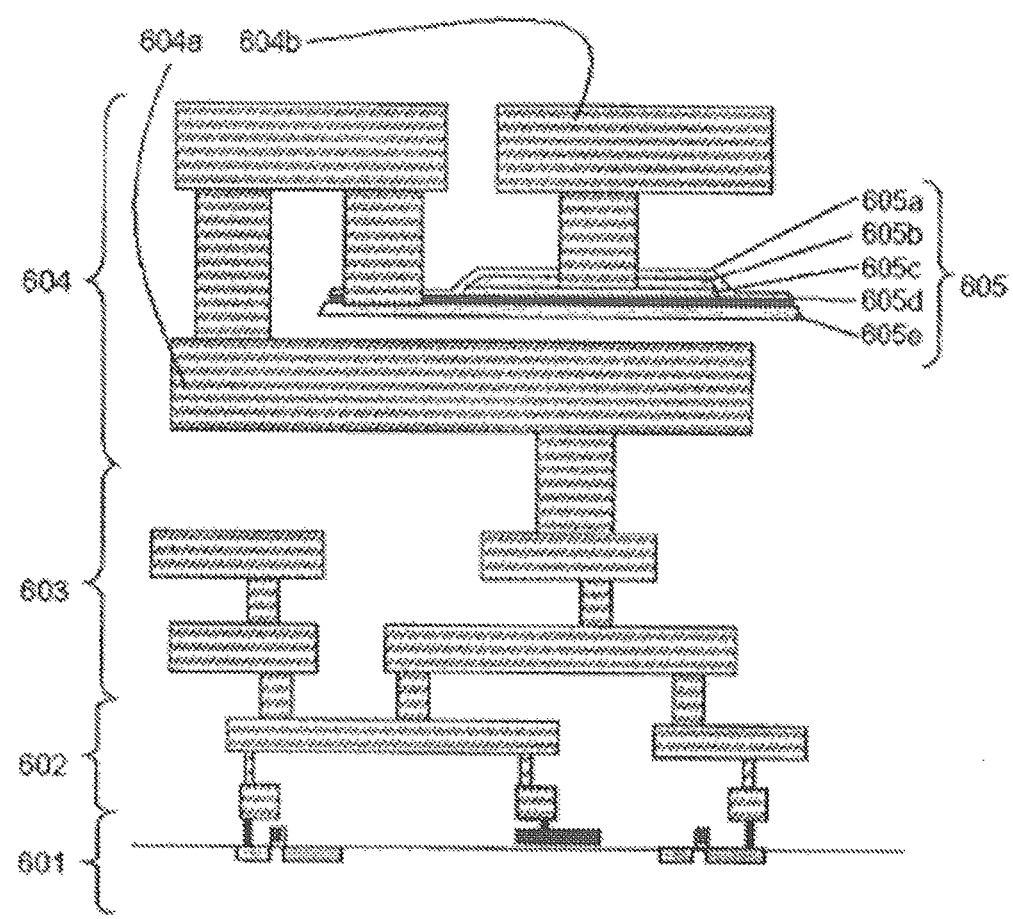
FIG. 15 A Cross-sectional view of a wiring structure in which the capacitive element is installed in the semiconductor device according to Embodiment 7 of the present invention.

FIG. 15 shows the structure of the capacitive element in the semiconductor device according to this embodiment. The capacitive element is formed for decoupling in a high performance and high speed processing semiconductor device.

Some high performance and high speed processing semiconductor devices have a multilayer wire composed of 10 or more laminated layers. Such a multilayer wire structure has a lowermost wiring layer region 602 composed of the first layer right above a transistor layer 601 or multiple layers including this first layer, in which wires are formed with small pitches and a small average wire length. A middle wiring layer region 603 composed of one or multiple layers in which wires are formed with larger pitches and a larger average wire length than those in the lowermost wiring layer region 602 is formed on the lowermost wiring layer region 602. An uppermost wiring layer region 604 composed of one or multiple layers in which wires are formed with larger pitches and a larger average wire length than those in the middle wiring layer region 603 is formed on the middle wiring layer region 603. Furthermore, pads for making connections to external circuits are provided on the uppermost wiring layer.

Generally, one or multiple lowermost wiring layer regions are often used to connect local transistors and called local wiring. The middle wiring layer region is often used to connect circuit blocks having specific functions and called semiglobal wiring. The uppermost wiring layer region is often used for power supply and clock distribution and called global wiring. The local wiring layer region 602 has small wire pitches as mentioned above and accordingly has large capacitance between wires, which delays signal transfer. Therefore, a low dielectric constant material such as a porous film and organic film is used as the insulating film insulating between wiring layers. Here, a low dielectric constant material means a material having a relative dielectric constant of 3.0 or lower.

Recent semiconductor devices are so small that a wiring structure using low dielectric constant materials is employed even in the semiglobal wiring. The global wiring is designed to have larger wire pitches so that a large quantity of electric current can be supplied. Then, capacitance between wires less affects signal transfer. In fact, a hard material such as a silicon oxide film is used for assisting the strength of the wiring structure or for obtaining high reliability. As wiring materials composing a multilayer structure, copper-based metals having low resistance is used for preventing signal transfer delay. Pads for making connections to external circuits are made of aluminum-based metals, which can be used as an additional wiring layer. In such a case, a layer of aluminum-based wiring is present on a copper-based multilayer structure wiring region.

A capacitive element intended for decoupling is inserted between a power supply voltage line of power supply wiring and a ground line. A capacitive element 605 shown in FIG. 15 is inserted in the global wiring layer region. The capacitive element 605 is composed of, for example, a hard mask 605a for forming a lower electrode pattern, a hard mask 605b for forming an upper electrode pattern, an upper electrode 605c, a tantalum silicate film 605d, and a lower electrode 605e. The capacitive element structure is not restricted to this structure and can be any structure as long as an oxide on the lower electrode has a high dielectric constant.

When an element 604a in FIG. 15 is a wire for supplying a power supply voltage, an element 604b is a ground wire. On the other hand, when the element 604a is a ground wire, the element 604b is a wire for supplying a power supply voltage. In this embodiment, the local, semiglobal, and global wiring regions are each composed of two layers. These regions are not restricted to a two-layer structure. They can be composed of a single layer or three or more layers. Furthermore, the entire structure can have a four or more wiring layer structure with the semiglobal wiring alone being composed of a multilayer hierarchical structure.

Embodiment 8

Figure 16:
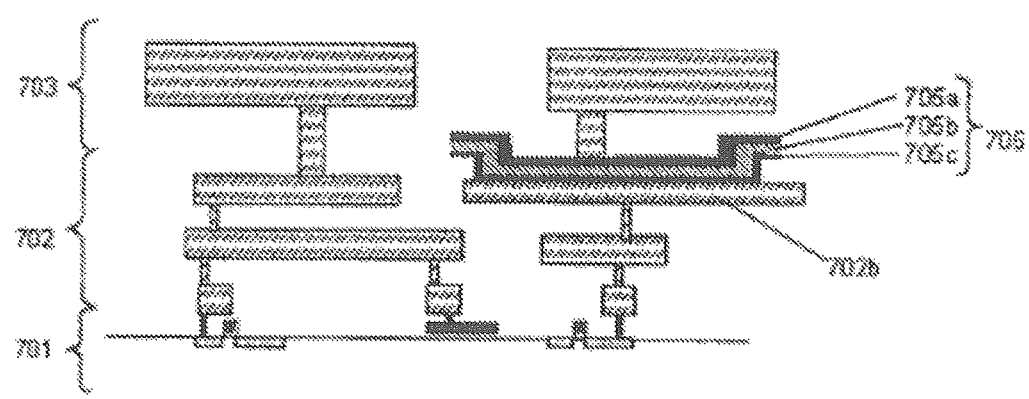
FIG. 16 A Cross-sectional view of a wiring structure in which the capacitive element is installed in the semiconductor device according to Embodiment 8 of the present invention.

FIG. 16 shows the structure of the capacitive element in the semiconductor device of this embodiment. This capacitive element is installed as a decoupling capacitance for low cost and low power consumption. It is important to reduce the number of wiring layers in order to realize low cost. Therefore, instead of the three-stage wiring layer structure as shown in Embodiment 6, a two-stage wiring layer structure composed of a local wiring layer region 702 having a single or multiple wiring layers formed directly on a transistor formation region 701 and a global wiring layer region 703 formed above the local wiring layer region is employed. Because of low power consumption operation, the global wiring layer can have relatively small wire pitches and be composed of a single layer. Then, a decoupling capacitance 705 is inserted between the uppermost wiring layer of the local wiring layer region 702 composed of multiple layers and the global wiring layer 703 composed of a single layer.

The decoupling capacitance 705 has an upper electrode 705a, a tantalum silicate film 705b, and a lower electrode 705c that is physically in contact with a local wire 702b via an opening. Here, the structure of the inserted decoupling capacitance is not restricted to this structure and can be any structure as long as an amorphous or microcrystalline thin film is provided on a polycrystalline lower electrode. FIG. 16 shows a three-layer local wiring. The local wiring layer can be composed of a single, two, or four or more layers. The global layer is shown as a single layer, however, it can be composed of two or more layers. In this exemplary structure, a two-level structure composed of local wiring and global wiring for achieving low cost is shown. If necessary, a semiglobal wiring layer region can be provided between these wiring layer regions without any problem. The capacitive element can also be inserted between the lowermost layer of the global wiring layer and the uppermost layer of the semiglobal wiring layer.

Embodiment 9

Generally, the position of a capacitive element is very important when constructing a semiconductor device for, for example, analog/RF (radio frequency) signal processing. In such signal processing, parasitic resistance and parasitic inductance accompanying electrodes, wires, and vias largely affect the circuit function in addition to the capacitive capability of the capacitive element. Therefore, it is necessary to reduce the wire length and number of vias connecting elements as much as possible in order to prevent such parasitic components. For this reason, it is desirable that the capacitive element is positioned in the lower region near transistors. The capacitive element having the structure shown in Embodiment 4 can utilize a low resistance wire material as an effective lower electrode, thereby reducing parasitic resistance of the electrode.

Figure 17:
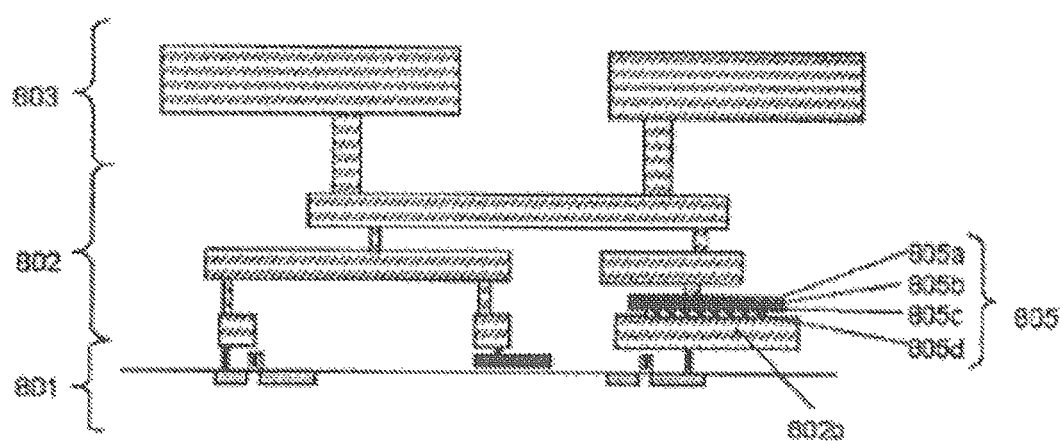
FIG. 17 A Cross-sectional view of a wiring structure in which the capacitive element is installed in the semiconductor device according to Embodiment 9 of the present invention.

FIG. 17 is a cross-sectional view showing the structure of the capacitive element of the semiconductor device according to this embodiment. In this embodiment, a capacitive element 805 is formed within a local wiring layer 802 composed of multiple layers formed directly on a transistor formation layer 801 so that the capacitive element can fully exert its circuit function. Here, the decoupling capacitance 805 is composed of an upper electrode 805a, a tantalum silicate film 805b, a lower electrode 805c, and a conductive plug 805d formed in an insulating film formed on a lower wire. The lower electrode 805c is physically in contact with a local wire 802b via a conductive plug. Here, the structure of the inserted decoupling capacitance is not restricted to this structure and can be any structure as long as an oxide on the polycrystalline lower electrode has a high dielectric constant.

As described above, the lower electrode 805c is physically in contact with an underlying low resistance wire via the conductive plug 805d embedded in an insulating film formed on the underlying low resistance wire. Therefore, the electrode can have a significantly small effective resistance. Furthermore, because of this, the electrode can have a significantly small thickness. The total thickness of the lower electrode 805c and a film 805d inserted on the lower electrode 805c for flattening the electrode surface can be reduced up to approximately 10 to 50 nm. As just described, the capacitive element having a small thickness is significantly advantageous for inserting the capacitive element in a local wiring layer where the distances between different wire layers are as small as 100 to 200 nm.

This exemplary structure is composed of the three-layer local wiring layer region 802 and the single-layer global wiring layer region 803. The wiring layer structure is not restricted thereto. The local wiring layer can be composed of a single, two, or four or more layer structure. The global wiring layer can be composed of two or more layers. Furthermore, a single layer or multilayer semiglobal wiring layer region can be provided between the local wiring layer region and global wiring layer region. The position of the capacitive element is not restricted to within the local wiring layer. The capacitive element can be positioned between the local wiring layer region and semiglobal wiring layer region or within the semiglobal wiring layer region.

In the semiconductor devices of the above embodiments, the transition metal silicate film is nearly $SiO_2$ because it has a silicon composition ratio higher in the upper part than in the lower part in the thickness direction of the transition metal silicate film. Then, process damage resistance during formation of an upper electrode film or during etching is improved and the occurrence of oxygen defects in the transition metal silicate film can be prevented. Therefore, current leakage can be reduced by using such a transition metal silicate film as a capacitive insulating film of a capacitive element. On the other hand, compared with the composition ratio of the transition metal, the silicon composition ratio composing a transition metal silicate film is close to 0 in the lower part of the film in the thickness direction of the transition metal silicate film. Therefore, the transition metal silicate film becomes similar to or identical to a transition metal oxide film, by which the relative dielectric constant can be increased. Hence, when such a metal silicate film is used as a capacitive insulating film of a capacitive element, the capacitance is advantageously increased.

In summary, the semiconductor device of the present invention can have the flowing structures.

In a semiconductor device provided with a capacitive element using a transition metal silicate film as a capacitive insulating film, the silicon composition ratio composing the transition metal silicate film can be lowered stepwise from the top to bottom of the film in the thickness direction of the transition metal silicate film.

The capacitive insulating film can be a film containing as the primary constituent an oxide of any one or multiple metals among tantalum, zirconium, hafnium, niobium, titanium, tungsten, cobalt, molybdenum, vanadium, lanthanum, manganese, chrome, yttrium, and praseodymium.

The silicon composition ratio to the total number of transition metal elements and silicon elements in the silicate film can be 50% or lower.

The transition metal element in the silicate film can be tantalum. The upper electrode of the capacitive element can be a titanium nitride film. The lower electrode of the capacitive element can be composed of any one of a titanium nitride film, tantalum film, tantalum nitride film, and nitrogen-containing tantalum film, or a laminated film of multiple materials. The transition metal film can be formed by sputtering.

In a semiconductor device having multilayer wiring, the capacitive element can be formed between a power supply line and a ground line in the multilayer wiring. Alternatively, the capacitive element can be provided between any wiring layers adjacent one on top of the other. In the uppermost layer, an aluminum-based wire can be formed and under that a multilayer copper wire can be formed. An interlayer insulating film composing at least one layer of the multilayer wire can contain an insulating material having a dielectric constant of 3.0 or lower.

The present invention is specifically illustrated and described with reference to exemplary embodiments above. The present invention is not confined to the above embodiments and their modifications. As apparent to a person of ordinary skill in the field, various modifications can be made to the present invention without departing from the spirit aid scope of the present invention set forth in the attached claims.

This application claims the benefit of Japanese Patent Application No. 2008-011210, filed on Jan. 22, 2008, the entire disclosure of which is incorporated by reference herein.

The invention claimed is:
1. A semiconductor device production method, comprising:

forming an electrode comprising a polycrystalline conductive film;

forming a transition metal film on the electrode;

forming a silicon-containing transition metal film by irradiating a surface of said transition metal film with a mono-silane gas; and oxidizing the silicon-containing transition metal film by an oxygen plasma treatment, thereby forming a transition metal silicate film, wherein the polycrystalline conductive film comprises a material having a higher oxidation resistance than a transition metal element of the transition metal silicate film.

2. The semiconductor device production method according to claim 1, wherein said forming the transition metal film includes sputtering.

3. The semiconductor device production method according to claim 1, wherein a silicon composition ratio of said transition metal silicate film is lowered stepwise towards a bottom.

4. The semiconductor device production method according to claim 1, wherein the electrode further comprises a ground layer formed below the polycrystalline conductive film.

5. The semiconductor device production method according to claim 4, wherein the ground layer includes a first film comprising titanium nitride, a second film comprising tantalum, and a third film comprising tantalum nitride.

6. The semiconductor device production method according to claim 5, wherein each of the second film and the third film comprises an amorphous film or a microcrystalline film laminated above the first film to flatten a surface of the ground layer.

7. The semiconductor device production method according to claim 5, wherein each of the second film and the third film comprises an amorphous film laminated above the first film to flatten a surface of the ground layer.

8. The semiconductor device production method according to claim 5, further comprising:

forming an upper electrode on the transition metal silicate film.

9. The semiconductor device production method according to claim 8, wherein the upper electrode comprises titanium nitride.

10. The semiconductor device production method according to claim 1, wherein the transition metal element of the transition metal silicate film comprises tantalum.

11. The semiconductor device production method according to claim 10, wherein the polycrystalline conductive film comprises titanium nitride.

12. A method of producing a capacitive element, said method comprising:

forming an upper electrode;

forming a capacitive insulating film on a bottom surface of the upper electrode, the capacitive insulating film comprising at least one of an oxide of a transition metal element and a silicate of a transition metal element; and forming a lower electrode on a bottom surface of the capacitive insulating film, the lower electrode comprising a polycrystalline conductive film comprising a material having a higher oxidation resistance than said transition metal element.

13. A method of producing a capacitive element according to claim 12, wherein the lower electrode further comprises a ground layer formed below the polycrystalline conductive film.

14. A method of producing a capacitive element according to claim 13, wherein the ground layer includes a first film comprising titanium nitride, a second film comprising tantalum, and a third film comprising tantalum nitride.

15. A method of producing a capacitive element according to claim 14, wherein each of the second film and the third film comprises an amorphous film or a microcrystalline film laminated above the first film to flatten a surface of the ground layer.

16. A method of producing a capacitive element according to claim 15, wherein the capacitive insulating film comprises the silicate.

17. A method of producing a capacitive element according to claim 16, wherein a Si composition of said capacitive insulating film is lowered stepwise from a top surface of the capacitive insulating film towards a bottom surface of the capacitive insulating film.

18. A method of producing a capacitive element according to claim 15, wherein the transition metal element in said capacitive insulating film comprises tantalum.

19. A method of producing a capacitive element according to claim 15, wherein said upper electrode comprises titanium nitride.

20. A method of producing a capacitive element according to claim 15, wherein said polycrystalline conductive film comprises a titanium nitride film.

* * * * *